United States Patent [19]
Martin

[11] Patent Number: 5,608,373
[45] Date of Patent: Mar. 4, 1997

[54] GLASS FRIT COMPOSITIONS AND ELECTRICAL CONDUCTOR COMPOSITIONS MADE THEREFROM COMPATIBLE WITH REDUCING MATERIALS

[75] Inventor: Tom O. Martin, Nappanee, Ind.

[73] Assignee: CTS Corporation, Elkhart, Ind.

[21] Appl. No.: 252,027

[22] Filed: Jun. 1, 1994

[51] Int. Cl.$^6$ .................................................. H01C 7/10
[52] U.S. Cl. .................. 338/21; 338/22 SD; 338/306; 501/77; 501/151; 501/21
[58] Field of Search ................................. 338/21, 22 R, 338/22 SD, 306; 501/15, 17, 63, 21, 57, 58, 65, 77, 151; 252/513

[56] References Cited

U.S. PATENT DOCUMENTS

| | | | |
|---|---|---|---|
| 4,376,169 | 3/1983 | Eppler | 501/24 |
| 4,493,900 | 1/1985 | Nishino et al. | 501/26 |
| 4,536,328 | 8/1985 | Hankey | 252/518 |
| 4,639,391 | 1/1987 | Kuo . | |
| 4,654,166 | 3/1987 | Hormadaly | 252/518 |
| 4,655,965 | 4/1987 | Kuo . | |
| 4,698,265 | 10/1987 | Kuo . | |
| 4,711,803 | 12/1987 | Kuo . | |
| 4,720,418 | 1/1988 | Kuo . | |
| 4,801,488 | 1/1989 | Smith | 501/17 |
| 4,818,730 | 4/1989 | Smith, III et al. | 501/15 |
| 5,043,302 | 8/1991 | Mattox . | |
| 5,082,804 | 1/1992 | Prabhu et al. . | |
| 5,093,285 | 3/1992 | Murkens . | |

FOREIGN PATENT DOCUMENTS 274018 11/1988 Japan .

Primary Examiner—Teresa J. Walberg
Assistant Examiner—Raphael Valencia
Attorney, Agent, or Firm—Albert W. Watkins; Michael W. Starkweather

[57] ABSTRACT

A glass frit for firing in reducing environments includes an unusually large amount of calcium fluoride melted therein. Also, a copper conductive composition includes the glass frit with an unusually large amount of calcium fluoride. This copper conductive composition may be a paste prepared for screen printing, in which case an appropriate screening agent known to one of ordinary skill may be incorporated, or the composition may be a fired film formed upon a suitable substrate. A high power surge resistor also incorporates the glass frit.

8 Claims, 3 Drawing Sheets

GLASS FRIT COMPOSITIONS AND ELECTRICAL CONDUCTOR COMPOSITIONS MADE THEREFROM COMPATIBLE WITH REDUCING MATERIALS

BACKGROUND OF THE INVENTION

1. Field of the Invention

This invention pertains to electrically conductive compositions having utility in electronics. Most particularly, the invention pertains to glass frit and thick film conductive and resistive materials fired in inert or reducing atmospheres. The inventive compositions are used together with or adjacent to materials which are highly reducing.

2. Description of the Related Art

Glass technology originated several thousand years ago. As is typical of an older, more mature technology, there are innumerable compositions designed for many diverse uses. Glass is simply all around us.

In the electronics industry glass plays a crucial role through the desirable features of temperature and humidity resistance, hermeticity, low thermal expansivity, low dielectric constant and high dielectric strength. For the purposes of this disclosure, glass compositions are herein defined to encompass all materials which might in process be reflowed or sintered, including devritifiable or crystalline compositions which might also often be referred to as glass-ceramics or simply as ceramics.

Thick film inks or pastes are well known in the industry, and a number of different glass compositions have been proposed for use therein. Several such compositions are illustrated in U.S. Pat. Nos. 5,043,302, 5,082,804 and 5,093,285 incorporated herein by reference. Commonly preferred glass compositions of the prior art often include borosilicates, due to high temperature characteristics, good thermal shock resistance, good chemical resistance and high moisture resistance typical of this type of glass. The borosilicates are so named because they include both boron and silicon in a silicate structure. Borosilicates may commonly also be referred to as lead borosilicates, aluminum borosilicates or other similar terms which identify other components of the glass composition beyond the silicon and boron.

In previous years, these well known borosilicate glasses performed admirably in many electronic applications, and in fact, these are likely a composition of choice in many, if not most, electronic applications. However, more recent opportunities have begun to reveal some limitations of these materials. Particularly with efforts to reduce the use of precious metals and also gain better electrical conductivity, the industry has begun to utilize more and more copper material to pattern conductive circuits. Copper provides reduced solder leaching and less moisture induced migration than does silver, while sacrificing little in intrinsic conductivity. However, because copper is readily oxidized when heated in an oxidizing atmosphere, processing of copper thick film circuits and materials requires firing in an inert or reducing atmosphere. Typically, dry nitrogen is used in the firing process.

While nitrogen is not in and of itself particularly reducing, the nitrogen firing required for the conductive will also affect the resistor material. This means that associated resistor materials must also be able to be fired in a nitrogen atmosphere. The industry standard ruthenium dioxide resistor material, also invented by the assignee of the present invention, does not fire properly in nitrogen, but is instead adversely affected. In conjunction with copper, other base metal materials are therefore commonly used as resistors. Among these materials are titanium silicide and tin oxide, as for example illustrated in U.S. Pat. Nos. 4,639,391, 4,655,965, 4,698,265, 4,711,803, and 4,720,418 assigned to the assignee of the present invention and incorporated herein by reference.

Titanium silicide has been found to be particularly reducing to surrounding oxide glass compositions when fired in nitrogen. This may lead to a change in component values and characteristics, and even loss of substrate adhesion, where prior art glass compositions are used. Other materials with which a similar problem would likely be encountered would include other silicide materials, as well as many borides and other similar materials of a somewhat reducing nature.

SUMMARY OF THE INVENTION

The present invention overcomes the limitations of prior art borosilicate glass compositions when applied to reducing environments through the inclusion of an unusually large amount of calcium fluoride. The glass composition of the present invention will include between zero and ten percent silica as $SiO_2$, ten and forty percent boron oxide as $B_2O_3$, ten and forty percent barium oxide as BaO, zero and ten percent alumina as $Al_2O_3$, zero and twenty percent calcium oxide as CaO, and thirty to fifty percent calcium fluoride as $CaF_2$. Other ingredients may be substituted therein as known equivalents. However, the inclusion of these substantial levels of calcium fluoride into the borosilicate glass has not been known heretofore in the art.

Further, the invention includes a composition of copper and glass, the glass of the composition hereinabove recited. This copper conductive composition may be a paste prepared for screen printing, in which case an appropriate screening agent known to one of ordinary skill may be incorporated, or the composition may be a fired film formed upon a suitable substrate.

DESCRIPTION OF THE PREFERRED EMBODIMENT

For the purposes of this disclosure, all percentages and parts referred to are calculated by weight. The preferred glass composition of the present invention includes five percent silica as $SiO_2$, thirty two percent boron oxide as $B_2O_3$, twenty percent barium oxide as BaO, three percent alumina as $Al_2O_3$, seven percent calcium oxide as CaO, and thirty three percent calcium fluoride as $CaF_2$.

Figure 1:
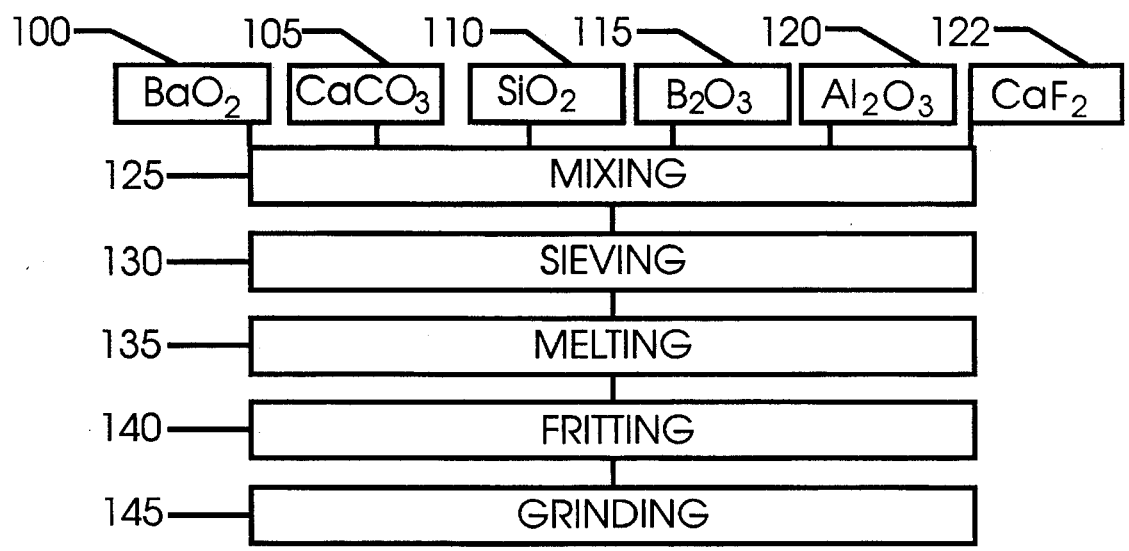

The glass is formulated as shown in FIG. 1 by using $BaO_2$ 100 as the precursor for BaO, and calcium carbonate ($CaCO_3$) 105 as the precursor for CaO. The glass composition is formulated with five parts silicon dioxide ($SiO_2$) 110, thirty two parts boron oxide ($B_2O_3$) 115, twenty two parts barium oxide ($BaO_2$) 100, three parts alumina ($Al_2O_3$) 120, twelve and one-half parts calcium carbonate ($CaCO_3$) 105, and thirty three parts calcium fluoride ($CaF_2$) 122. These materials are preferably obtained as powders which are mixed together at step 125 and forced through a sieve in step 130 to break up agglomerates. The mixture is melted in step 135 at 1,150° Centigrade in a zircon crucible for approximately thirty minutes and poured into de-ionized water to yield a frit at step 140. The frit should be relatively smooth and white. The glass frit, if desired, may be ground in step 145 to a smaller particle size.

Other ingredients may be substituted therein as known equivalents. For example, the barium oxide content provides a lower melting point in the fritted glass, and so an equivalent material would desirably reduce the melting point. Alternatively, the exclusion of the barium oxide component would not prevent the formation of a frit, but would rather raise the processing temperature of the frit to cause fusion. This translates into higher firing temperatures for the composition upon a substrate, which would need to be specifically designed into later processes and compositions. However, the inclusion of the substantial levels of calcium fluoride into the borosilicate glass has not been known heretofore in the art and is believed to be essential to the proper performance of the invention.

Figure 2:
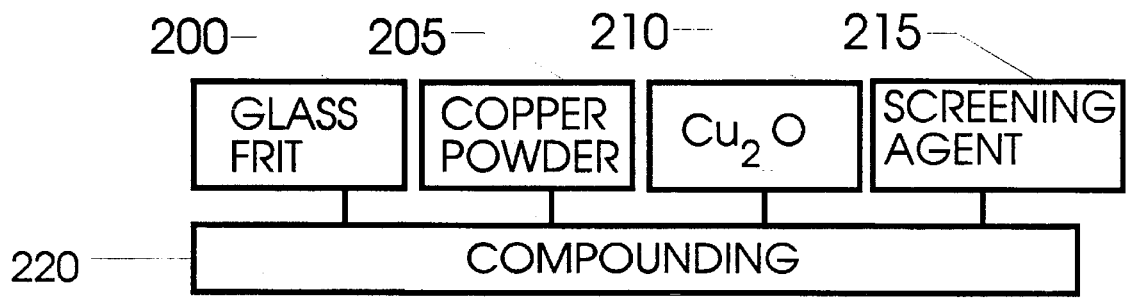

The glass frit 200 in another embodiment shown in FIG. 2 is then compounded at step 220 with copper powder 205, copper oxide 210 and an appropriate screening agent 215 to yield a thick film copper conductive paste suited for screen printing and firing. In this instance, the preferred composition will include ninety two parts copper powder, six parts copper oxide as $Cu_2O$, two parts glass frit, and fifteen parts of a suitable screening agent.

Those of ordinary skill will know or be able to determine readily the variability of the different components depending upon the quality, particle size, and specific screening agent selected and be able to vary the copper formulation accordingly to take into account such process variables. Some examples of suitable screening agents are described in U.S. Pat. No. 5,082,804 referenced and incorporated previously.

The agglomerate particle size is important in the performance of the preferred embodiment. In the preferred embodiment, the composition will be roller milled until the agglomerates have an average size of between 13 and 26 micrometers, to obtain optimum adhesion characteristics.

Figure 3:
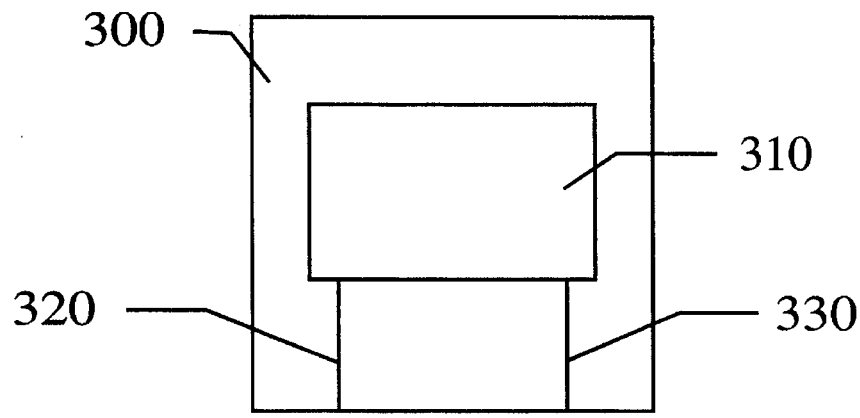
Figure 4:
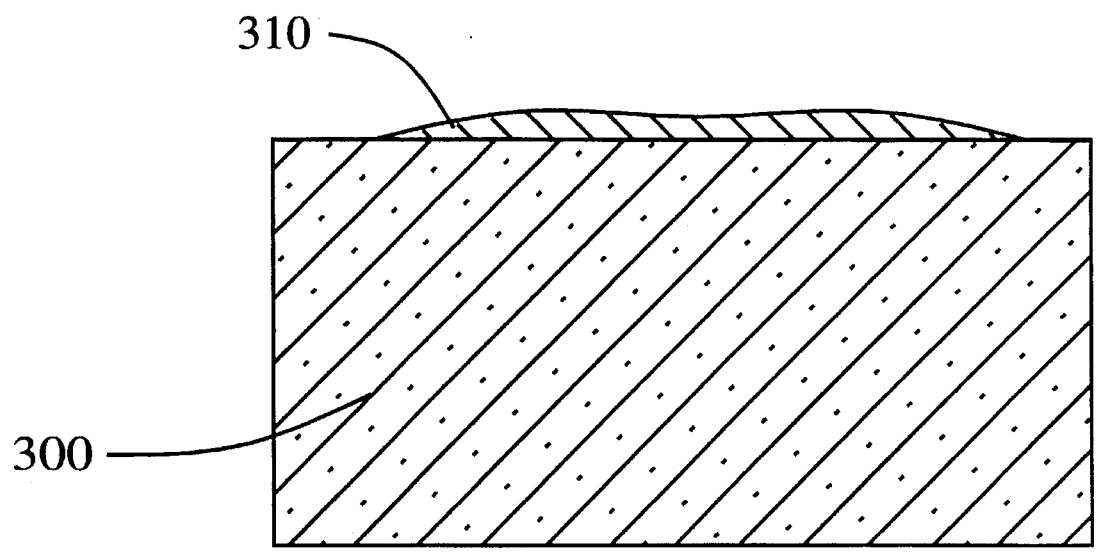

The copper conductive paste in yet a further embodiment shown in FIGS. 3 and 4 can be screen printed upon a substrate 300 which is preferably an alumina refractory material, though other alternative materials may be suitable as known to those of ordinary skill. The substrate 300 carrying the paste is preferably fired in a nitrogen inert atmosphere furnace or kiln. Volatile screening agent is "burned off" and evaporated at lower temperatures. Sintering and fusing of the copper, copper oxide and glass frit occurs as the temperature reaches the peak firing temperature. The resulting film 320, 330 is highly electrically conductive and fully compatible with reducing compositions including those reducing compositions with silicide or boride content such as resistor 310.

While other glass compositions, including several borosilicates, are known as being relatively non-reducing, these heretofore known materials are very high melting materials. By the incorporation of the present ingredients, the firing temperature necessary to fuse or sinter the glass and bond the glass to the substrate is only 900° Centigrade. This temperature is sufficiently low as to enable firing in a NICHROME element resistance kiln, providing a significant cost and compatibility advantage over higher temperature materials.

EXAMPLE I

A glass frit was formulated by mixing five parts (all parts and percentages by weight, as noted hereinabove) silica as $SiO_2$, thirty-two parts boron oxide ($B_2O_3$), twenty-two parts barium oxide ($BaO_2$), three parts alumina ($Al_2O_3$), twelve and one-half parts calcium carbonate ($CaCO_3$), and thirty-three parts calcium fluoride ($CaF_2$). These materials were mixed together and forced through a sieve to break up agglomerates. The mixture was melted at 1,150° Centigrade in a zircon crucible for approximately thirty minutes and poured into de-ionized water to yield a frit. The frit was subsequently ball milled to powder.

EXAMPLE II

A copper conductive composition was prepared by compounding the powdered glass frit of example I with copper powder, copper oxide and an appropriate screening agent to yield a thick film copper conductive paste suited for screen printing and firing. Ninety two parts copper powder, six parts copper oxide as $Cu_2O$, two parts glass frit, and fifteen parts of a suitable screening agent were mixed together and then roller milled to an average agglomerate size of approximately 13 micrometers.

EXAMPLE III

The copper conductive paste of example II was screen printed upon an alumina substrate and fired in a nitrogen inert atmosphere kiln to a peak temperature of 900° Centigrade.

COMPARATIVE EXAMPLE IV

A prior art copper thick film composition was prepared and fired upon an alumina substrate, to serve as a comparative example.

COMPARATIVE EXAMPLE V

A copper composition was formulated as in example II. However, a purchased glass selected to be most similar to the glass of example I was substituted for the glass of example I.

RESULTS

The thick films of example III and comparative examples IV and V were tested for several characteristics including soldered adhesion and epoxy peel strength. The thick films were tested both without and with an interface to titanium silicide resistors, similar to those outlined in U.S. Pat. No. 4,639,391, to measure the affect of the reducing composition on substrate adhesion. The results are tabulated below. The numbers shown are average pounds of force measured from multiple samples to separate a two millimeter by two millimeter square pad from the substrate. In the epoxy test, noteworthy is the fact that the epoxy directly bonded to alumina failed in the epoxy at an average of 4.4 pounds of force.

| TEST | EXAMPLE III | EXAMPLE IV | EXAMPLE V |
| --- | --- | --- | --- |
| SOLDER PEEL | 9.2 | 7.0 | 8.6 |
| SILICIDE I, EPOXY PEEL | 5.8 | 1.8 | 2.4 |
| SILICIDE II, EPOXY PEEL | 5.8 | 1.9 | 2.8 |

The table illustrates the substantially improved adhesion of the present invention, particularly when interfaced to reducing compositions such as silicide resistors.

EXAMPLE VI

The copper composition of example III was combined with silicide resistors similar to those outlined in U.S. Pat. No. 4,639,391. A test pattern was formed using the two materials and the resultant part was tested to failure comparatively to commercially available thick film materials for high power surge performance. The materials prepared in accord with the teachings of the present invention, when combined with the titanium silicide resistor material, were found to outperform all commercially available surge materials known to applicant. There were some twelve different commercially available materials tested. The test parts produced in accord with the present invention consistently survived larger applications of power repeated more times and for longer durations than the compositions commercially available.

While the foregoing details what is felt to be the preferred embodiment of the invention, no material limitations to the scope of the claimed invention is intended. Further, features and design alternatives that would be obvious to one of ordinary skill in the art are considered to be incorporated herein. The scope of the invention is set forth and particularly described in the claims hereinbelow.

I claim:

1. An electrically conductive composition comprising:
    a glass frit having between thirty and fifty percent calcium fluoride and between ten and forty percent boron oxide, said calcium fluoride and boron oxide melted and then fritted;
    copper oxide; and
    copper.

2. A thick film conductor comprising copper, copper oxide and glass frit, said glass frit having between thirty and fifty percent calcium fluoride melted therein.

3. The thick film conductor of claim 2 wherein said glass frit further comprises between zero and ten percent silica, between ten and forty percent barium oxide as BaO, between zero and ten percent alumina, and between zero and twenty percent calcium oxide.

4. A base metal resistor comprising:
    a reducing resistive material;
    a conductor trace with conductor glass frit and conductive means, said conductor glass frit having between thirty and fifty percent calcium fluoride melted therein;
    said reducing resistive material terminated by said conductor trace.

5. A surge resistor comprising:
    a reducing resistive material;
    a conductor trace with conductor glass frit and conductive means, said conductor glass frit having between thirty and fifty percent calcium fluoride melted therein;
    said reducing resistive material terminated by said conductor trace.

6. The surge resistor of claim 5 wherein said reducing resistive material is selected from the group of silicides and borides.

7. The surge resistor of claim 6 wherein said conductor glass frit further comprises between zero and ten percent silica, between ten and forty percent barium oxide as BaO, between zero and ten percent alumina, and between zero and twenty percent calcium oxide.

8. The surge resistor of claim 5 wherein said conductive means comprises copper.

* * * * *